(12) United States Patent
Nakashiba

(10) Patent No.: US 8,810,042 B2
(45) Date of Patent: Aug. 19, 2014

(54) SEMICONDUCTOR DEVICE

(71) Applicant: Renesas Electronics Corporation, Kawasaki (JP)

(72) Inventor: Yasutaka Nakashiba, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/667,955

(22) Filed: Nov. 2, 2012

(65) Prior Publication Data

US 2013/0056849 A1 Mar. 7, 2013

Related U.S. Application Data

(63) Continuation of application No. 12/662,442, filed on Apr. 16, 2010, now Pat. No. 8,310,025.

(30) Foreign Application Priority Data

Apr. 20, 2009 (JP) ................. 2009-102278

(51) Int. Cl.
*H01L 23/48* (2006.01)

(52) U.S. Cl.
USPC .... 257/777; 257/531; 257/499; 257/E27.046; 257/E23.169

(58) Field of Classification Search
USPC ........... 257/777, 531, 499, E27.046, E23.169
See application file for complete search history.

(56) References Cited

U.S. PATENT DOCUMENTS

| 5,952,849 A | 9/1999 | Haigh |
| 6,680,518 B2 | 1/2004 | Forbes |
| 7,235,477 B2 | 6/2007 | Ogawa |

FOREIGN PATENT DOCUMENTS

| JP | 2001-513276 | 8/2001 |
| JP | 2008-113093 | 5/2006 |

*Primary Examiner* — Kimberly Rizkallah
*Assistant Examiner* — Timor Karimy
(74) *Attorney, Agent, or Firm* — McGinn IP Law Group, PLLC

(57) ABSTRACT

A semiconductor device includes a semiconductor chip having a multilayer interconnect, a first spiral inductor and a second spiral inductor formed in the multilayer interconnect, and an interconnect substrate formed over the semiconductor chip and having a third spiral inductor and a fourth spiral inductor. The third spiral inductor overlaps the first spiral inductor in a plan view. The fourth spiral inductor overlaps the second spiral inductor in the plan view. The third spiral inductor and the fourth spiral inductor collectively include a line, the line being spirally wound in a same direction in the third spiral inductor and the fourth spiral inductor.

14 Claims, 5 Drawing Sheets

SEMICONDUCTOR DEVICE

The present application is a Continuation Application of U.S. patent application Ser. No. 12/662,442, filed on Apr. 16, 2010, which is based on and claims priority from Japanese patent application No. 2009-102278, filed on Apr. 20, 2009, the entire contents of which is incorporated herein by reference.

BACKGROUND

1. Technical Field

The present invention relates to a semiconductor device that is capable of transferring electric signals between two circuits to which electric signals having different potentials from each other are input.

2. Related Art

To transfer electric signals between two circuits to which electric signals having different potentials from each other are input, photo couplers are often used. Each photo coupler includes a light emitting element such as a light emitting diode and a light receiving element such as a photo transistor. The light emitting element converts an input electric signal into light, and the light receiving element returns the light to an electric signal. In this manner, photo couplers transfer electric signals.

However, it is difficult to reduce the size of each photo coupler due to the existence of the light emitting element and the light receiving element. Also, where the frequency of electric signals is high, the photo couplers cannot follow the electric signals. To counter these problems, there has been a technique for transmitting electric signals by inductively coupling two inductors, as disclosed in Japanese translation of PCT international application NO. 2001-513276, for example.

A structure in which pairs of inductors are used when a first semiconductor chip on the transmission side and a second semiconductor chip on the reception side are connected to each other through a transmission path is disclosed in Japanese Laid-open patent publication NO. 2008-113093. More specifically, the transmission line and the first semiconductor chip are connected in a noncontact manner by electromagnetically coupling the pair of inductors on the transmission side. The transmission line and the second semiconductor chip are connected in a noncontact manner by electromagnetically coupling the pair of inductors on the reception side.

The present inventor has recognized as follows. Where a transmission-side circuit and a reception-side circuit are connected through an interconnect substrate, the transmission-side circuit and the interconnect substrate may be connected by a pair of inductors, and the interconnect substrate and the reception-side circuit may be connected by a pair of inductors. In such a case, two pairs of inductors are used. Therefore, there is a possibility that signal attenuation occurs while signals are being transferred, and the signals cannot be transferred accurately. To transfer signals accurately, the distance between two inductors forming the pairs of inductors may be made shorter. However, where the reference voltage of the transmission-side circuit and the reference voltage of the reception-side circuit differ from each other, insulation between the transmission-side circuit and the reception-side circuit cannot be secured, if the distance between the two inductors forming the pairs of inductors is made shorter at each two pairs of inductors. Therefore, it is difficult to secure insulation between the transmission-side circuit and the reception-side circuit while signals are being transferred accurately.

SUMMARY

In one embodiment, there is provided a semiconductor device including:
a semiconductor chip having a multilayer interconnect,
a first spiral inductor and a second spiral inductor formed in the multilayer interconnect, and
an interconnect substrate formed over the semiconductor chip and having a third spiral inductor and a fourth spiral inductor,
wherein the third spiral inductor overlaps the first spiral inductor in a plan view,
wherein the fourth spiral inductor overlaps the second spiral inductor in the plan view, and
wherein the third spiral inductor and the fourth spiral inductor collectively comprise a line, the line being spirally wound in a same direction in the third spiral inductor and the fourth spiral inductor.

According to the embodiment, the distance from the first inductor to the third inductor differs from the distance from the second inductor to the fourth inductor. The breakdown voltage between the first circuit and the second circuit is determined by the sum of the distance from the first inductor to the third inductor and the distance from the second inductor to the fourth inductor. Therefore, the sum of the distance from the first inductor to the third inductor and the distance from the second inductor to the fourth inductor needs to be equal to or larger than a certain value. When a semiconductor device is designed, the required value is divided between the distance from the first inductor to the third inductor and the distance from the second inductor to the fourth inductor. The distance from the first inductor to the third inductor and the distance from the second inductor to the fourth inductor differ from each other, and have appropriate values. With this arrangement, the efficiency in signal transmission from the first circuit to the second circuit can be maximized. Accordingly, insulation can be secured between the first circuit and the second circuit while signals are being transferred accurately.

According to the embodiment, even where the interconnect substrate and the first circuit on the transmission side are connected by a pair of inductors, and the interconnect substrate and the second circuit on the reception side are connected by a pair of inductors, insulation can be secured between the first circuit and the second circuit while signals are being accurately transferred.

In a second embodiment, a semiconductor device includes
a first semiconductor chip having a first multilayer interconnect,
a second semiconductor chip having a second multilayer interconnect,
a first spiral inductor formed in the first multilayer interconnect,
a second spiral inductor formed in the second multilayer interconnect, and
an interconnect substrate formed over the first semiconductor chip and having a third spiral inductor and a fourth spiral inductor,
wherein the third spiral inductor overlaps the first spiral inductor in a plan view,
wherein the fourth spiral inductor overlaps the second spiral inductor in the plan view, and wherein the third spiral inductor and the fourth spiral inductor collectively comprise a line, the line being spirally wound in a same direction in the third spiral inductor and the fourth spiral inductor.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

Figure 1:
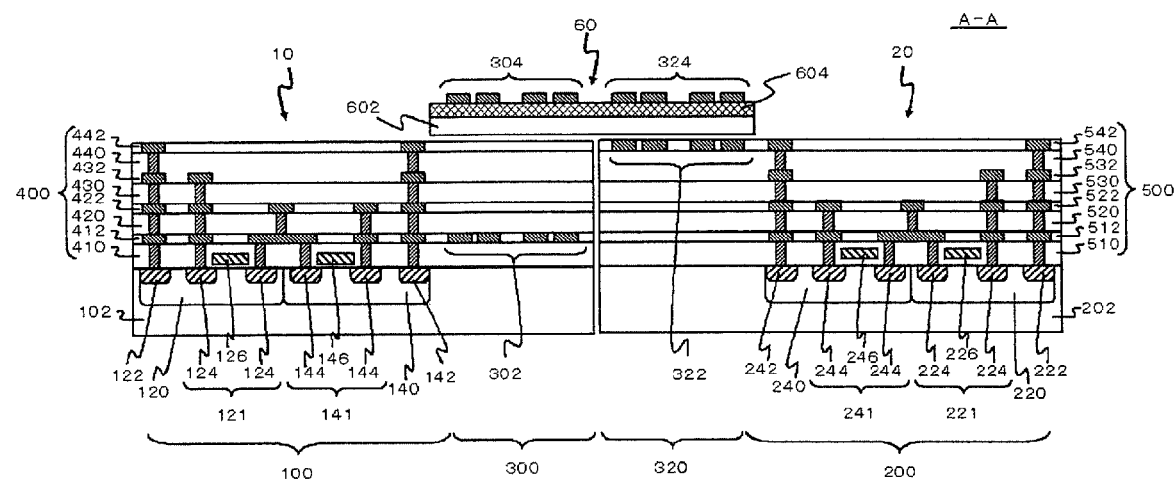
FIG. 1 is a cross-sectional view showing the structure of a semiconductor device according to a first embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

The following is a description of embodiments of the present invention, with reference to the accompanying drawings. In the drawings, like components are denoted by like reference numerals, and explanation of them will not be repeated made in the following description.

First Embodiment

Figure 2:
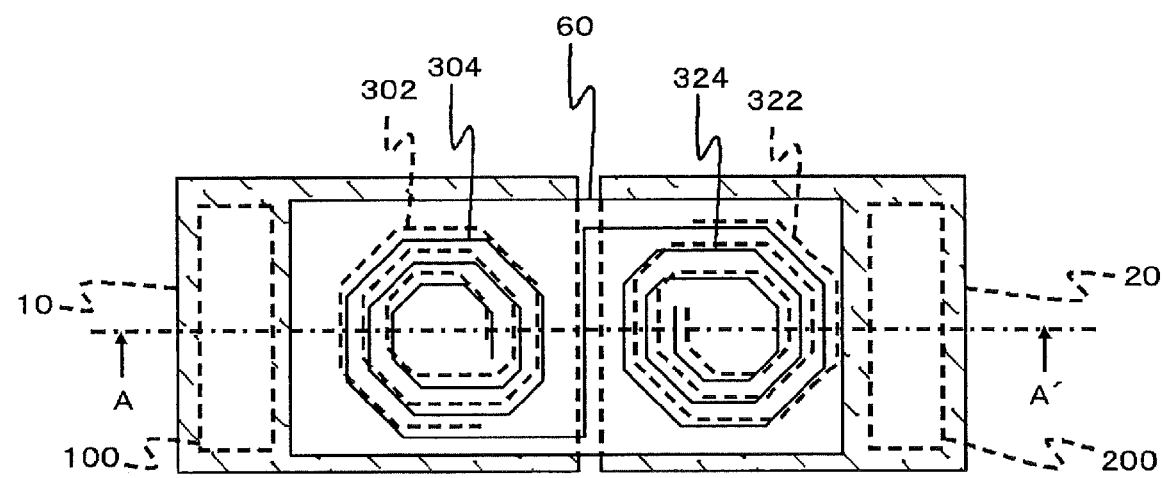
FIG. 2 is a schematic plan view of the semiconductor device shown in FIG. 1.

FIG. 1 is a diagram showing the structure of a semiconductor device according to a first embodiment. FIG. 2 is a schematic plan view of the semiconductor device shown in FIG. 1. FIG. 1 is a cross-sectional view of the semiconductor device, taken along the line A-A' of FIG. 2. For simplification of the drawings, the number of windings in each of the later described first inductor 302 and second inductor 322 in FIG. 1 differs from the number of windings shown in FIG. 2. This semiconductor device includes two semiconductor chips 10 and 20, and an interconnect substrate 60. The semiconductor chip 10 includes a multilayer interconnect 400, and the semiconductor chip 20 includes a multilayer interconnect 500.

The semiconductor chip 10 includes a first substrate 102, a first circuit 100, and a first inductor 302. The first substrate 102 is a semiconductor substrate such as a silicon substrate. The first circuit 100 generates signals to be transmitted. The first inductor 302 is formed in the multilayer interconnect 400. The first inductor 302 is connected to the first circuit 100, and receives the signals generated by the first circuit 100.

The semiconductor chip 20 includes a second substrate 202, a second circuit 200, and the second inductor 322. The second substrate 202 is a semiconductor substrate such as a silicon substrate. The second circuit 200 receives and processes the signals generated by the first circuit 100. The second inductor 322 is formed in the multilayer interconnect 500. The second inductor 322 is connected to the second circuit 200, and transmits signals to the second circuit 200. The signals to be transmitted are digital signals, for example, but those signals may also be analog signals.

The interconnect substrate 60 is placed over the first inductor 302 of the semiconductor chip 10 and the second inductor 322 of the semiconductor chip 20. The interconnect substrate 60 is attached to the semiconductor chip 10 and the semiconductor chip 20 through an adhesive agent (not shown), for example. The interconnect substrate 60 includes a third inductor 304 and a fourth inductor 324. The third inductor 304 is located above the first inductor 302. The fourth inductor 324 is located above the second inductor 322, and is connected to the third inductor 304. The distance from the first inductor 302 to the third inductor 304 is longer than the distance from the second inductor 322 to the fourth inductor 324. Each of the inductors is a spiral interconnect pattern.

In the example illustrated in FIG. 1, the interconnect substrate 60 is a silicon interposer that is formed with a silicon substrate 602. The interconnect substrate 60 may be an interposer or an interconnect substrate using a substrate made of resin. Where the interconnect substrate 60 is formed with the use of the silicon substrate 602, and the first substrate 102 and the second substrate 202 are silicon substrates, the impurity density in the silicon substrate of the interconnect substrate 60 is preferably lower than the substrate impurity density in the first substrate 102 and the substrate impurity density in the second substrate 202. With this arrangement, generation of eddy current in the silicon substrate 602 can be restrained.

In this embodiment, the third inductor 304 and the fourth inductor 324 are formed on the opposite face of the interconnect substrate 60 from the semiconductor chip 10 and the semiconductor chip 20. The third inductor 304 and the fourth inductor 324 are formed on an interconnect layer 604 formed on the silicon substrate 602. The interconnect layer 604 is a multilayer interconnect, and the third inductor 304 and the fourth inductor 324 are connected to each other through an interconnect (not shown) in the interconnect layer 604.

The first inductor 302 and the third inductor 304 constitute a first signal transmission element 300, and the second inductor 322 and the fourth inductor 324 constitute a second signal transmission element 320. As described above, the distance from the first inductor 302 to the third inductor 304 differs from the distance from the second inductor 322 to the fourth inductor 324.

More specifically, the first inductor 302 is formed in the multilayer interconnect 400 of the semiconductor chip 10, and the second inductor 322 is formed in the multilayer interconnect 500 of the semiconductor layer 20. In each of the multilayer interconnects 400 and 500, two or more insulating layers and two or more interconnect layers are alternately stacked, with an insulating layer being at the lowermost layer. In this embodiment, the multilayer interconnect 400 has a structure that is formed by stacking an insulating layer 410, an interconnect layer 412, an insulating layer 420, an interconnect layer 422, an insulating layer 430, an interconnect layer 432, an insulating layer 440, and an interconnect layer 442 in this order. The multilayer interconnect 500 has a structure that is formed by stacking an insulating layer 510, an interconnect layer 512, an insulating layer 520, an interconnect layer 522, an insulating layer 530, an interconnect layer 532, an insulating layer 540, and an interconnect layer 542 in this order. Each of the insulating layers may have a structure formed by stacking insulating films, or may be a single insulating film. Each of the multilayer interconnects 400 and 500 is covered with a protection film (not shown). The number of layers in the multilayer interconnect 400 and the number of layers in the multilayer interconnect 500 may be the same as each other or differ from each other.

In the example illustrated in this drawing, the first inductor 302 is provided in the interconnect layer 412 that is a first interconnect layer of the multilayer interconnect 400, and the second inductor 322 is provided in the interconnect layer 542 that is the uppermost layer of the multilayer interconnect 500.

The interconnect of each of the interconnect layers is a Cu interconnect formed by the damascene technique, and is buried in a groove formed in each corresponding interconnect layer. Pads (not shown) are formed on the interconnects of the uppermost layers. Alternatively, in the multilayer interconnects 400 and 500, at least one of the interconnect layers may be an Al-alloy interconnect. The interconnects formed in the interconnect layers are connected to one another through plugs buried in the insulating layers.

Each of the insulating films forming the insulating layers and the interconnect layers may be a $SiO_2$ film or a low-permittivity film. Low-permittivity films may be insulating films having relative permittivity of 3.3 or lower, or more preferably, 2.9 or lower. Examples of materials that can be used as the low-permittivity films include not only SiOC but also polyhydrogen siloxane such as HSQ (hydrogen silsesquioxane), MSQ (methyl silsesquioxane), or MHSQ (methylated hydrogen silsesquioxane), an aromatic-group-containing organic material such as polyarylether (PAE), divinylsiloxane-bis-benzocyclobutene (BCB), or Silk (a registered trade name), SOG, FOX (flowable oxide) (a registered trade name), CYTOP (a registered trade name), BCB (Benzocyclobutene), and the likes. Porous films of those substances may also be used as low-permittivity films.

Where the thickness of the multilayer interconnect 400 and the thickness of the multilayer interconnect 500 differ from each other, the interconnect substrate 60 might be slanted. In such a case, the backgrinding amount of the first substrate 102 and the backgrinding amount of the second substrate 202 are changed so that the semiconductor chip 10 and the semiconductor chip 20 have the same thickness.

The first circuit 100 is a transmission circuit, and the second circuit 200 is a reception circuit. Accordingly, the first inductor 302 functions as a transmission-side inductor, and the third inductor 304 functions as a reception-side inductor. Also, the fourth inductor 324 functions as a transmission-side inductor, and the second inductor 322 functions as a reception-side inductor.

For example, the first circuit 100 is a transmission-side driver circuit (such as a gate driver). The first circuit 100 amplifies a transmission signal formed by modulating a digital signal, and outputs the amplified signal to the first inductor 302. For example, the second circuit 200 is a reception-side driver circuit (such as a gate driver). The second circuit 200 amplifies and then outputs a digital signal formed by modulating a signal received by the second inductor 322.

The potentials of electric signals to be input to the first circuit 100 and the second circuit 200 differ from each other. However, since the first signal transmission element 300 and the second signal transmission element 320 transmit electric signals by virtue of inductive coupling, no trouble occurs in the first circuit 100 and the second circuit 200. Where "the potentials of electric signals to be input differ from each other" in the structure illustrated in FIG. 1, the amplitudes (the differences between the potential indicating "0" and the potential indicating "1") of the electric signals might differ from each other, the reference potentials (the potentials indicating "0") of the electric signals might differ from each other, the amplitudes of the electric signals might differ from each other while the reference potentials of the electric signals differ from each other, or the like.

The first circuit 100 of the semiconductor chip 10 includes first transistors. The first transistors are an n-type transistor and a p-type transistor. The n-type first transistor 121 is formed in a p-type well 120, and includes two n-type impurity regions 124 to be the source and drain, and a gate electrode 126. The p-type first transistor 141 is formed in an n-type well 140, and includes two p-type impurity regions 144 to be the source and drain, and a gate electrode 146. A gate insulating film is provided below each of the gate electrodes 126 and 146. Those two gate insulating films have substantially the same thicknesses. The first transistors 121 and 141 constitute the above-mentioned transmission-side driver circuit that is an inverter, for example.

A p-type impurity region 122 is formed in the well 120, and an n-type impurity region 142 is formed in the well 140. An interconnect for applying the reference potential (the ground potential) of the n-type first transistor 121 is connected to the impurity region 122, and an interconnect for applying the power-supply potential of the p-type first transistor 141 is connected to the impurity region 142.

The second circuit 200 of the semiconductor chip 20 includes second transistors. The second transistors are an n-type transistor and a p-type transistor. The n-type second transistor 221 is formed in a p-type well 220, and includes two n-type impurity regions 224 to be the source and drain, and a gate electrode 226. The p-type second transistor 241 is formed in an n-type well 240, and includes two p-type impurity regions 244 to be the source and drain, and a gate electrode 246. A gate insulating film is provided below each of the gate electrodes 226 and 246. The second transistors 221 and 241 constitute the above-mentioned reception-side driver circuit that is an inverter, for example.

A p-type impurity region 222 is formed in the well 220, and an n-type impurity region 242 is formed in the well 240. An interconnect for applying the reference potential of the n-type second transistor 221 is connected to the impurity region 222, and an interconnect for applying the power-supply potential of the p-type second transistor 241 is connected to the impurity region 242.

In the example illustrated in this drawing, the gate insulating films of the first transistors 121 and 141 and the gate insulating films of the second transistors 221 and 241 have different thicknesses from each other, but may have the same thicknesses.

The area of the interconnect substrate 60 is smaller than the sum of the area of the semiconductor chip 10 and the area of the semiconductor chip 20.

Figure 3:
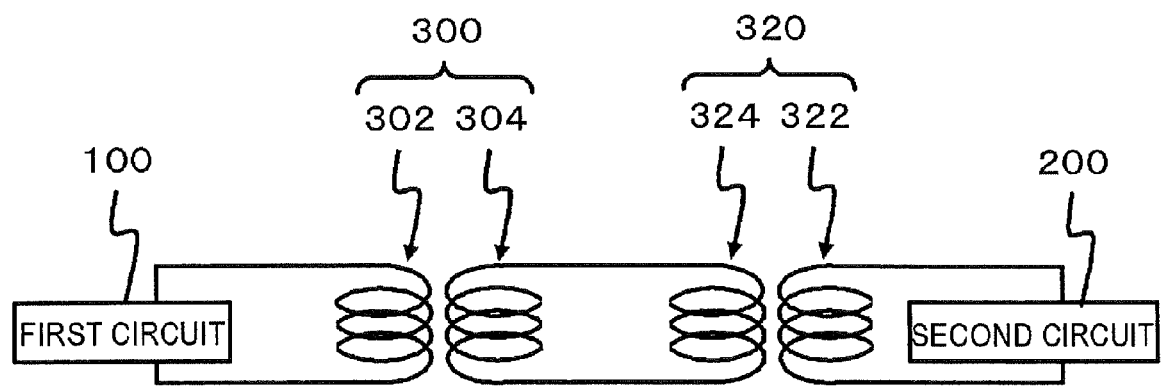
FIG. 3 is an equivalent circuit diagram of the semiconductor device shown in FIG. 1.

FIG. 3 is an equivalent circuit diagram of the semiconductor device shown in FIG. 1. The signals generated by the first circuit 100 are received by the second circuit 200 through the first signal transmission element 300 and the second signal transmission element 320. The first signal transmission element 300 transmits the signals by virtue of the inductive coupling between the first inductor 302 and the third inductor 304. The second signal transmission element 320 transmits the signals by virtue of the inductive coupling between the fourth inductor 324 and the second inductor 322.

Next, the functions and effects of this embodiment are described. The potentials of electric signals to be input to the first circuit 100 and the second circuit 200 differ from each other. The breakdown voltage between the first circuit 100 and the second circuit 200 is determined by the sum of the distance between the first inductor 302 and the third inductor 304, and the distance between the second inductor 322 and the fourth inductor 324. Therefore, the sum of the distance between the first inductor 302 and the third inductor 304, and the distance between the second inductor 322 and the fourth inductor 324 needs to be equal to or larger than a certain value. When a semiconductor device is designed, the required value is divided between the distance from the first inductor 302 to the third inductor 304 and the distance from the second inductor 322 to the fourth inductor 324. The distance between the first inductor 302 and the third inductor 304, and the distance between the second inductor 322 and the fourth inductor 324 differ from each other, and have appropriate values. With this arrangement, the efficiency in signal transmission from the first circuit 100 to the second circuit 200 can be maximized. In this embodiment, the distance from the first inductor 302 to the third inductor 304 differs from the distance from the second inductor 322 to the fourth inductor 324. Accordingly, insulation between the first circuit 100 and the second circuit 200 can be secured while signals are being transferred with precision.

For example, since the first inductor 302 that is the transmission-side inductor of the first signal transmission element 300 is connected to the first circuit 100 that is a transmission circuit, a relatively large current flows in the first inductor 302. On the other hand, since the inductive current flowing through the third inductor 304 that is the reception-side inductor of the first signal transmission element 300 flows into the fourth inductor 324, a relatively small current flows in the four inductor 324 that is the transmission-side inductor of the second signal transmission element 320. Therefore, a relatively large inductive current is generated in the third inductor 304 that is the reception-side inductor of the first signal transmission element 300, and a relative small inductive current is generated in the second inductor 322 that is the reception-side inductor of the second signal transmission element 320. Accordingly, where the first inductor 302 is placed in the interconnect layer 412 that is the lowermost layer of the multilayer interconnect 400, and the second inductor 322 is placed in the uppermost interconnect layer of the multilayer interconnect 500 as in this embodiment, the signal transmission efficiency of the second signal transmission element 320 can be made higher while the breakdown voltage in the first signal transmission element 300 is secured.

In this embodiment, the third inductor 304 is formed on the opposite face of the interconnect substrate 60 from the semiconductor chip 10. Accordingly, the first inductor 302 and the third inductor 304 can be separated farther away from each other so that the breakdown voltage of the first signal transmission element 300 can be made higher.

Also, when the substrate impurity density in the silicon substrate 602 of the interconnect substrate 60 is made lower than the substrate impurity density of the first substrate 102 and the substrate impurity density of the second substrate 202, generation of eddy current in the silicon substrate 602 can be restrained by virtue of magnetic fields generated by the first signal transmission element 300 and the second signal transmission element 320.

Second Embodiment

Figure 4:
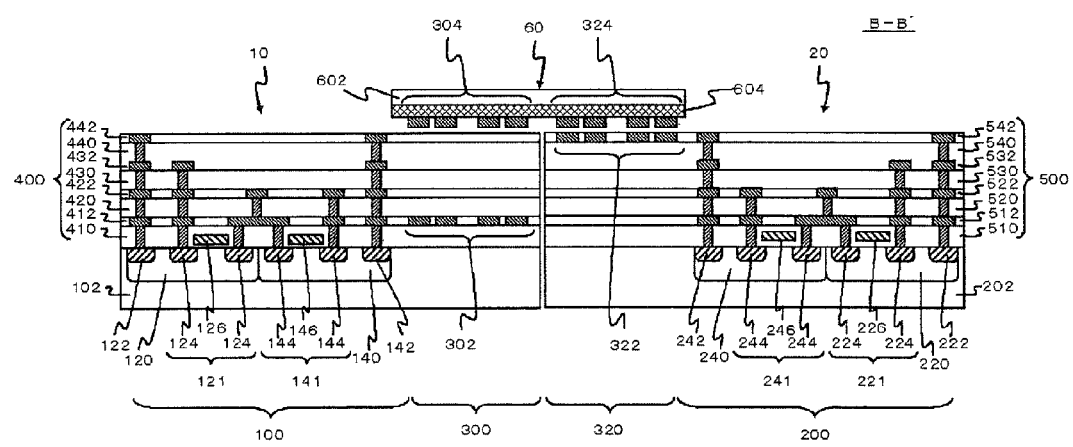
FIG. 4 is a cross-sectional view showing the structure of a semiconductor device according to a second embodiment.
Figure 5:
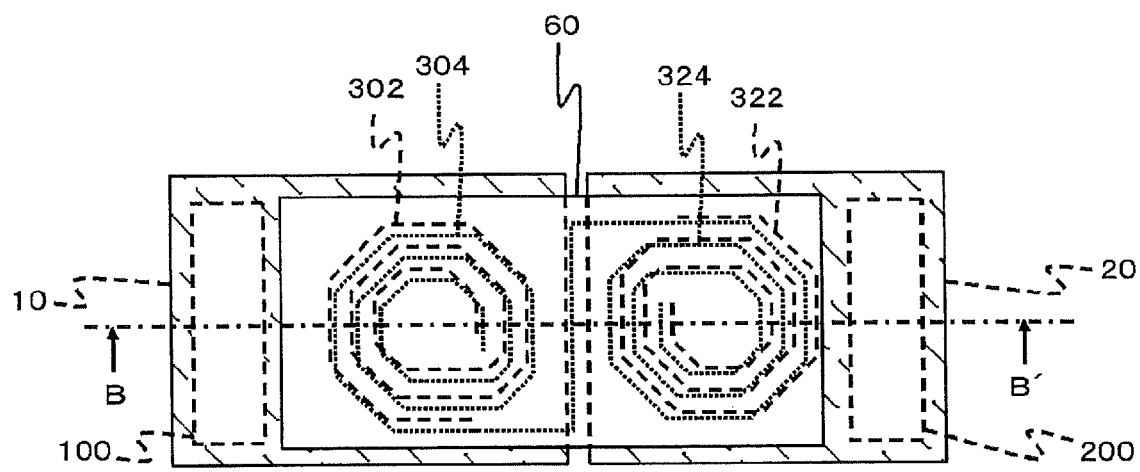
FIG. 5 is a schematic plan view of the semiconductor device shown in FIG. 4.

FIG. 4 is a cross-sectional view showing the structure of a semiconductor device according to a second embodiment. FIG. 5 is a schematic plan view of the semiconductor device shown in FIG. 4. FIG. 4 is a cross-sectional view of the semiconductor device, taken along the line B-B' of FIG. 5. This semiconductor device has the same structure as the semiconductor device according to the first embodiment, except that the third inductor 304 and the fourth inductor 324 are formed on the face of the interconnect substrate 60 that faces the semiconductor chip 10 and the semiconductor chip 20.

According to this embodiment, insulation between the first circuit 100 and the second circuit 200 can also be secured while signals are being transferred with precision. Further, the fourth inductor 324 is formed on the face of the interconnect substrate 60 facing the semiconductor chip 20. With this arrangement, the distance between the fourth inductor 324 and the second inductor 322 is shortened, and the signal transmission efficiency of the second signal transmission element 320 can be made higher accordingly.

Third Embodiment

Figure 6:
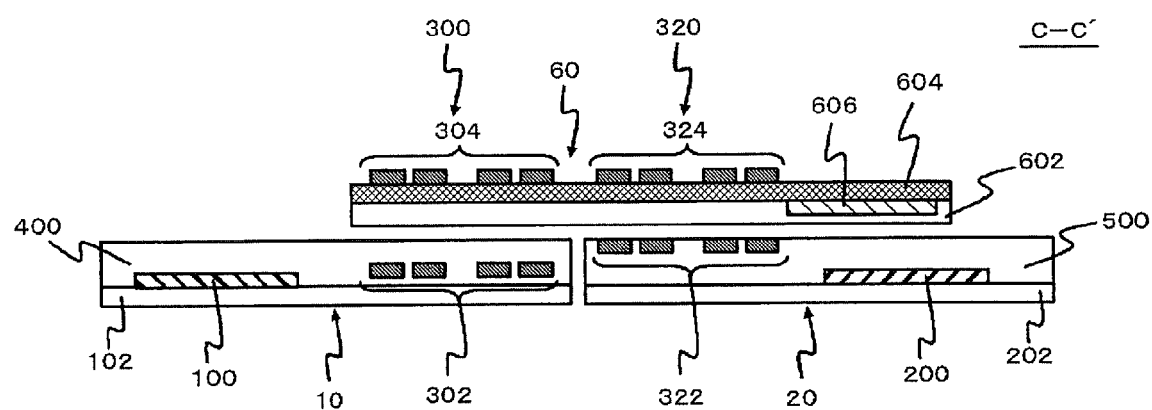
FIG. 6 is a schematic cross-sectional view showing the structure of a semiconductor device according to a third embodiment.
Figure 7:
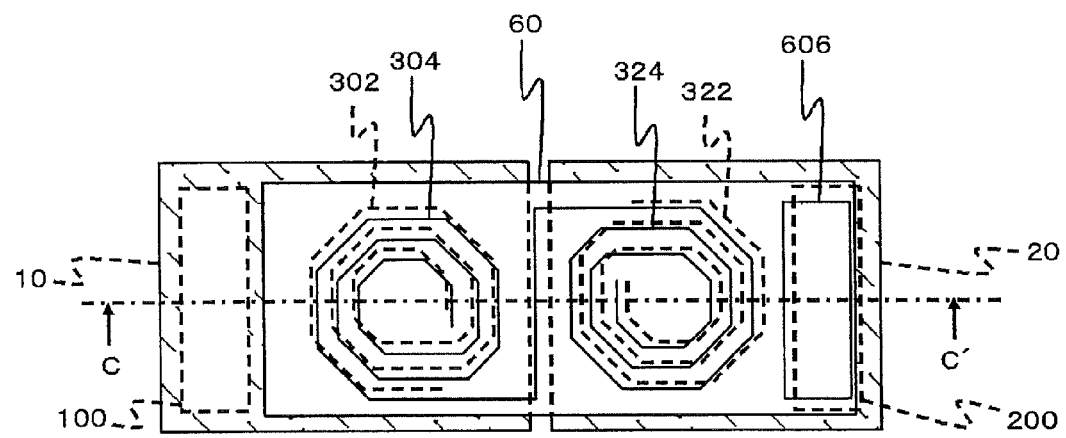
FIG. 7 is a schematic plan view of the semiconductor device shown in FIG. 6.

FIG. 6 is a schematic cross-sectional view showing the structure of a semiconductor device according to a third embodiment. FIG. 7 is a schematic plan view of the semiconductor device shown in FIG. 6. FIG. 6 is a cross-sectional view of the semiconductor device, taken along the line C-C' of FIG. 7. This semiconductor device has the same structure as the semiconductor device according to the first embodiment, except that a transmission/reception circuit 606 is formed in the face of the silicon substrate 602 having the interconnect layer 604 formed thereon.

Figure 8:
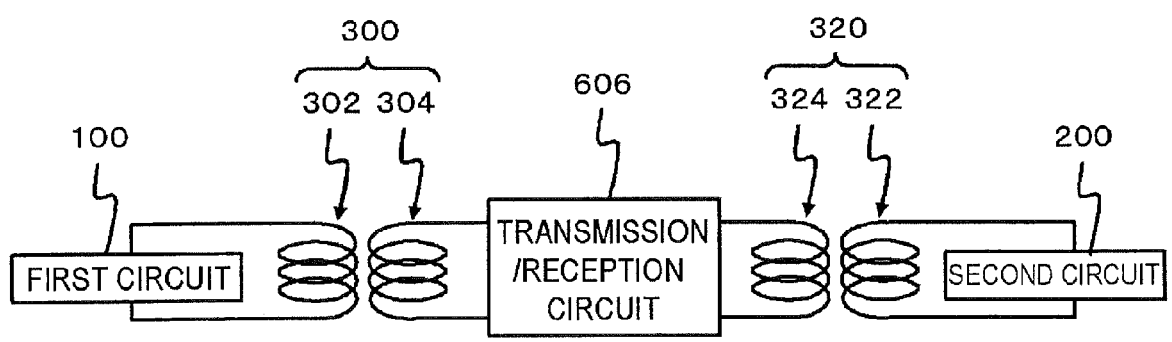
FIG. 8 is an equivalent circuit diagram of the semiconductor device shown in FIG. 6.

FIG. 8 is an equivalent circuit diagram of the semiconductor device shown in FIGS. 6 and 7. The transmission/reception circuit 606 is provided between the third inductor 304 and the fourth inductor 324 in the circuit diagram. The transmission/reception circuit 606 includes a reception circuit and a transmission circuit. After demodulating a signal received by the third inductor 304 from the first inductor 302, the transmission/reception circuit 606 re-modulates the signal and outputs the re-modulated signal to the fourth inductor 324. Although the transmission/reception circuit 606 shown in FIG. 6 is formed in the face of the interconnect substrate 60 having the interconnect layer 604 formed thereon, the transmission/reception circuit 606 may be formed in the opposite face from the face on which the interconnect layer 604 is formed.

This embodiment can achieve the same effects as those of the first or second embodiment. Furthermore, after demodulating a signal received by the third inductor 304 from the first inductor 302, the transmission/reception circuit 606 re-modulates the signal and outputs the re-modulated signal to the fourth inductor 324. Accordingly, the signal transmission efficiency is made even higher.

Fourth Embodiment

Figure 9:
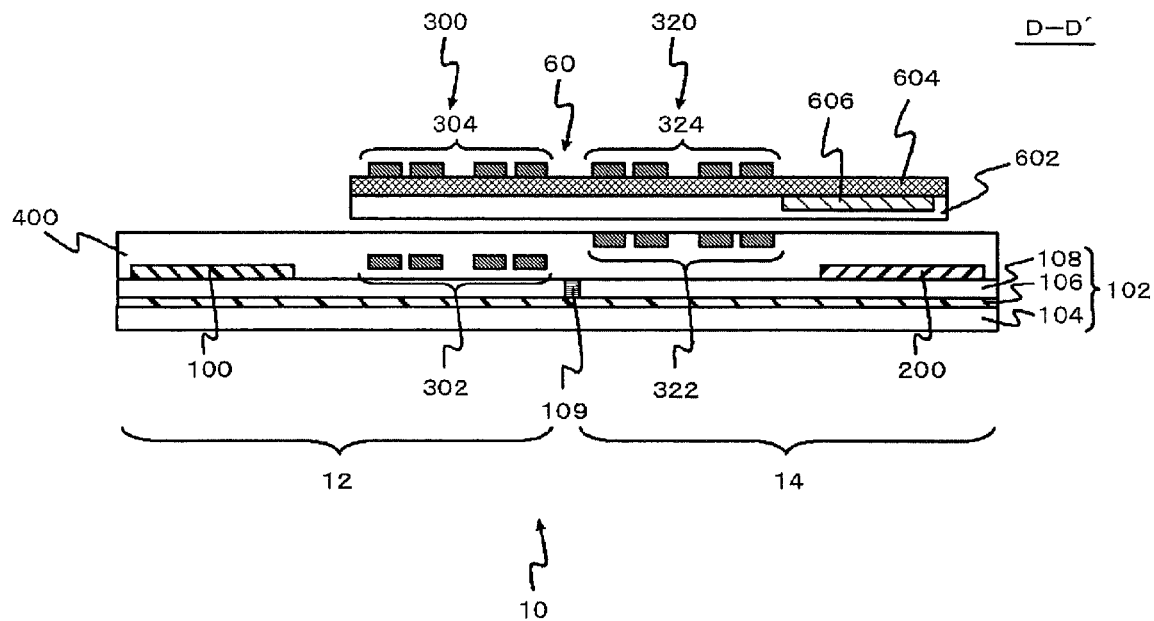
FIG. 9 is a schematic cross-sectional view showing the structure of a semiconductor device according to a fourth embodiment.
Figure 10:
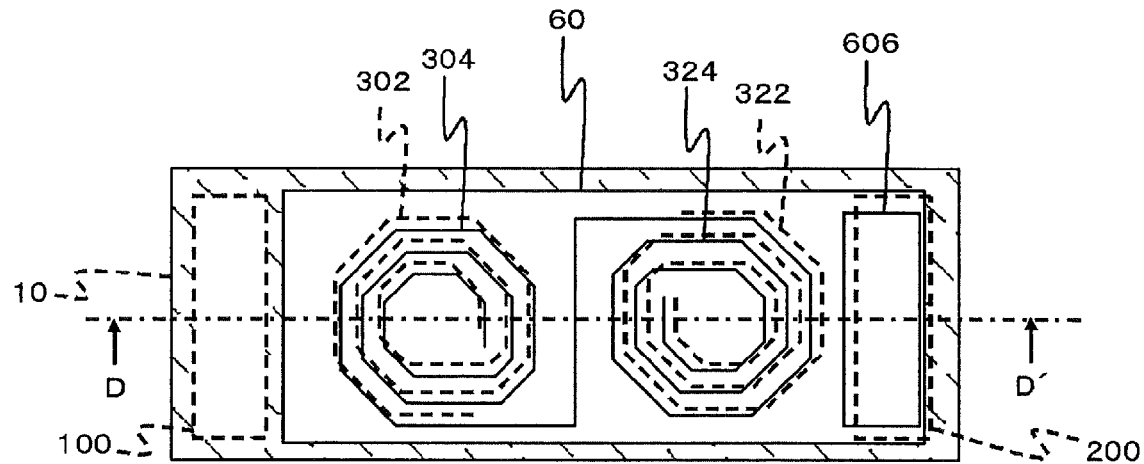
FIG. 10 is a schematic plan view of the semiconductor device shown in FIG. 9.

FIG. 9 is a schematic cross-sectional view showing the structure of a semiconductor device according to a fourth embodiment. FIG. 10 is a schematic plan view of the semiconductor device shown in FIG. 9. FIG. 9 is a cross-sectional view of the semiconductor device, taken along the line D-D' of FIG. 10. This semiconductor device has the same structure as one of the semiconductor devices according to the first through third embodiments, except that first circuit 100 and the first inductor 302 are formed in the first region 12 of the semiconductor chip 10, and the second circuit 200 and the second inductor 322 are formed in the second region 14 of the semiconductor chip 10. FIGS. 9 and 10 illustrate the same situation as that in the third embodiment.

The first substrate 102 is a SOI (Silicon On Insulator) substrate, and has a structure having an insulating layer 106 and a silicon layer 108 stacked in this order on a silicon substrate 104. A dielectric isolation layer 109 that insulates the first region 12 and the second region 14 from each other is buried in the silicon layer 108. The lower end of the dielectric isolation layer 109 reaches the insulating layer 106.

According to this embodiment, the same effects as those of any of the first through third embodiments can also be achieved. Furthermore, the first circuit 100 as a transmission circuit and the second circuit 200 as a reception circuit may be formed in the semiconductor chip 10.

Although embodiments of the present invention have been described so far with reference to the accompanying drawings, those embodiments are merely examples of the present invention, and various structures other than the above described ones may be employed.

It is apparent that the present invention is not limited to the above embodiment, but may be modified and changed without departing from the scope and spirit of the invention.

What is claimed is:

1. A semiconductor device comprising:
   a semiconductor chip having a multilayer interconnect,
   a first spiral inductor and a second spiral inductor formed in the multilayer interconnect, and
   an interconnect substrate formed over the semiconductor chip and having a third spiral inductor and a fourth spiral inductor,
   wherein the third spiral inductor overlaps the first spiral inductor in a plan view,
   wherein the fourth spiral inductor overlaps the second spiral inductor in the plan view, and
   wherein the third spiral inductor and the fourth spiral inductor collectively comprise a line, the line being spirally wound in a same direction in the third spiral inductor and the fourth spiral inductor.

2. The semiconductor device according to claim 1,
   wherein a distance between the first spiral inductor and the third spiral inductor is different from a distance between the second spiral inductor and the fourth spiral inductor.

3. The semiconductor device according to claim 1,
   wherein the line in the third spiral inductor and the fourth spiral inductor is spirally wound counter-clockwise toward their outside.

4. The semiconductor device according to claim 1,
   wherein the interconnect substrate is formed with a silicon substrate.

5. The semiconductor device according to claim 4,
   wherein the semiconductor chip is formed with a silicon substrate, and
   the interconnect substrate has a lower substrate impurity density than a substrate impurity density of the semiconductor chip.

6. The semiconductor device according to claim 4, further comprising a transmission/reception circuit that is formed in the interconnect substrate and is provided between the third spiral inductor and the fourth spiral inductor in a circuit diagram.

7. The semiconductor device according to claim 1, further comprising:
   a first circuit connected to the first spiral inductor; and
   a second circuit connected to the second spiral inductor,
   wherein potentials of electric signals to be input to the first circuit and the second circuit differ from each other.

8. A semiconductor device comprising:
   a first semiconductor chip having a first multilayer interconnect;
   a second semiconductor chip having a second multilayer interconnect;
   a first spiral inductor formed in the first multilayer interconnect;
   a second spiral inductor formed in the second multilayer interconnect; and
   an interconnect substrate formed over the first semiconductor chip and having a third spiral inductor and a fourth spiral inductor,
   wherein the third spiral inductor overlaps the first spiral inductor in a plan view,
   wherein the fourth spiral inductor overlaps the second spiral inductor in the plan view, and
   wherein the third spiral inductor and the fourth spiral inductor collectively comprise a line, the line being spirally wound in a same direction in the third spiral inductor and the fourth spiral inductor.

9. The semiconductor device according to claim 8,
   wherein a distance between the first spiral inductor and the third spiral inductor is different from a distance between the second spiral inductor and the fourth spiral inductor.

10. The semiconductor device according to claim 8,
    wherein the line in the third spiral inductor and the fourth spiral inductor is spirally wound counter-clockwise toward their outside.

11. The semiconductor device according to claim 8,
    wherein the interconnect substrate is formed with a silicon substrate.

12. The semiconductor device according to claim 11,
    wherein the first semiconductor chip and the second semiconductor chip are formed with a silicon substrate, and
    the interconnect substrate has a lower substrate impurity density than a substrate impurity density of the first semiconductor chip and the second semiconductor chip.

13. The semiconductor device according to claim 11, further comprising a transmission/reception circuit that is formed in the interconnect substrate and is provided between the third spiral inductor and the fourth spiral inductor in a circuit diagram.

14. The semiconductor device according to claim 8, further comprising:
    a first circuit connected to the first spiral inductor; and
    a second circuit connected to the second spiral inductor,
    wherein potentials of electric signals to be input to the first circuit and the second circuit differ from each other.

* * * * *